(12) United States Patent
Lee

(10) Patent No.: US 6,388,312 B2
(45) Date of Patent: May 14, 2002

(54) REPAIRABLE MULTI-CHIP PACKAGE

(75) Inventor: Dong H. Lee, Seoul (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/822,480

(22) Filed: Apr. 2, 2001

(30) Foreign Application Priority Data

Apr. 20, 2000 (KR) ........................................ 2000-20982

(51) Int. Cl.[7] ................................................ H01L 23/02
(52) U.S. Cl. ........................................ 257/678; 257/690
(58) Field of Search .............................. 257/690, 678, 257/679, 693, 723

(56) References Cited

U.S. PATENT DOCUMENTS 6,222,259 B1 * 4/2001 Park et al. .................. 257/690
6,246,615 B1 * 6/2001 King et al. .................. 365/200

* cited by examiner

*Primary Examiner*—David Nelms
*Assistant Examiner*—Long K. Tran
(74) *Attorney, Agent, or Firm*—Volentine Francos, PLLC

(57) ABSTRACT

A repairable multi-chip package is provided. The repairable multi-chip package comprises a first chip, a second chip, a substrate, and a molding part formed by molding the first chip and the second chip with a molding resin. The substrate comprises a substrate body and wiring patterns, the substrate body has an upper surface on which the first chip and the second chip are mounted and a lower surface. The wiring patterns are formed on the upper surface of the substrate and are electrically interconnected to the first and second chips. The wiring pattern comprises ground patterns, power patterns, dual patterns, and most significant bit (MSB) patterns. By redistributing exposed parts of the power patterns, the dual patterns, and the MSB patterns, a multi-chip package that is determined to be a partially-failed package may be repaired making the device useable.

13 Claims, 5 Drawing Sheets

REPAIRABLE MULTI-CHIP PACKAGE

This application relies for priority upon Korean Patent Application No. 2000-20982, filed on Apr. 20, 2000, the contents of which are herein incorporated by reference in their entirety.

BACKGROUND OF THE INVENTION

The present invention relates to a semiconductor device package. More particularly, the present invention relates to a repairable multi-chip package including a plurality of two-dimensionally mounted chips.

Recently, increases in memory density, i.e., memory storage capacity, have been continually required to keep up with rapid developments in modern digital technology. However, the current rate of increase for memory density does not presently satisfy this pressing demand. In order to improve the memory density, a multi-chip package design including a plurality of bare semiconductor integrated chips has been widely employed in application for DRAMs, SRAMs, Flash memories, and the like.

A multi-chip package for memory cards such as smart media is generally assembled by mounting two or more memory chips within a single package. However, this kind of multi-chip package has the drawback in that it has a low test yield after the assembly process. In other words, compared to a semiconductor package that has only a single memory chip, a multi-chip package has a comparatively low test yield.

One of the reasons for this is that in a multi-chip package, even if there is only one failed chip, or several failed chips among a plurality of chips, the multi-chip package is considered a failure. Because of this, the multi-chip package has a higher failure rate than other packages. Preferably, when the assembled multi-chip package is measured as a failure, only the failed chips should be removed. However, after the assembly process, since the multi-chip package is sealed with the molding resin such as EMC (Epoxy Molding Compound). As a result, in order to remove the failed memory chips, the multi-chip package would have to be disassembled in a way that would destroy them.

In the multi-chip package having at least two chips, there are two methods of increasing the memory capacity. The first method is to broaden the bus width of data, as it is used in the memory module. The second method is retain a given bus width of data, but to broaden the address. As shown in the example below, a multi-chip package 100 in FIG. 1 uses the second method.

FIG. 1 shows a conventional multi-chip package 100, in which two semiconductor chips 10 and 20 are mounted on an upper surface 34 of a substrate 30. As shown in FIG. 1, the multi-chip package 100 is generally employed on a memory card such as a smart media. The chips 10 and 20 are arranged to be coplanar on the upper surface 34 of the substrate 30 and are referred to as "a first chip" 10 and "a second chip" 20, respectively. The first and second chips 10 and 20 are mounted on the substrate 30 and are molded by a liquid molding resin, thereby forming a molding part 50. The first and second chips 10 and 20 are electrically connected to the substrate 30 by bonding wires 60.

In this design the first and second chips 10 and 20 are memory chips with the same capacitance. A plurality of electrode terminals are formed on both edges of the active surface of each chip 10 and 20. The electrode terminals of the first chip 10 comprise a first power terminal 12, a first ground terminal 13, a second power terminal 14, a most significant bit (MSB) terminal 15, a second ground terminal 16, and a dual terminal 17. The first power terminal 12 and the first ground terminal 13 are arranged on one edge of the active surface of the first chip 10, and the second power terminal 14, the MSB terminal 15, the second ground terminal 16, and the dual terminal 17 are arranged on the opposite edge.

Similarly, the electrode terminals of the second chip 20 comprise a first power terminal 22, a first ground terminal 23, a second power terminal 24, an MSB terminal 25, a second ground terminal 26, and a dual terminal 27. The first power terminal 22 and the first ground terminal 23 are arranged on one edge of the active surface of the second chip 20, and the second power terminal 24, the MSB terminal 25, the second ground terminal 26, and the dual terminal 27 are arranged on the opposite edge.

The first chip 10 and the second chip 20 are designed so that both the first chip 10 and the second chip 20 are dually operated. However, only one chip from among the first and second chips 10 and 20 can be operated at a time.

The substrate 30 comprises a substrate body 32 having an upper surface 34 and a lower surface (not shown), and a plurality of wiring patterns 40. The first chip 10 and the second chip 20 are mounted on the upper surface 34. The wiring patterns 40 are formed on the upper surface 34, and are electrically interconnected to the first chip 10 and the second chip 20. A plurality of external connection terminals (not shown), which are electrically interconnected to the wiring patterns 40 of the upper surface 34, are formed on the lower surface of the substrate 30.

The wiring patterns 40 are dually patterned and simultaneously operate the first chip 10 and the second chip 20. Ground patterns 42 are electrically connected to the first ground terminal 13 of the first chip 10 and to the first ground terminal 23 of the second chip 20, respectively. Power patterns 41 electrically connect the first power terminal 12 of the first chip 10 and the first power terminal 22 of the second chip 20 to each other. In order to prevent interference between the ground patterns 42 and the power patterns 41, a part of the power patterns 41 is formed on the upper surface 34 within the perimeter of the chips 10 and 20. The portion of the power patterns 41 that is formed in this manner is the portion connected from the first power terminal 12 of the first chip 10 to the first power terminal 22 of the second chip 20.

Dual patterns 49 serve to transmit a signal for dual operation of the first and second chips 10 and 20. The dual patterns 48 comprise first dual patterns 47 for connecting the dual terminal 17 and the second ground terminal 16 of the first chip 10 to each other, and second dual patterns 48 for connecting the dual terminal 27 and the second ground terminal 26 of the second chip 20 to each other. In this design, one end of the second dual patterns 48 is connected to the first dual patterns 47.

Most significant bit (MSB) patterns 45 are connected to the MSB terminal 15 for selecting the first chip 10 or the second chip 20. The MSB patterns 45 comprise first MSB patterns 43 for being connected to the second power terminal 14 of the first chip 10 and a second MSB patterns 44 for being connected to the MSB terminal 15 of the first chip and to the second power terminal 24 of the second chip 20. In this design, one end of the second MSB patterns 44 is connected to the first MSB patterns 43 within the perimeter of the molding part 50, and the other end of the second MSB patterns 44 is exposed to the outside before the second power terminal 24 of the second chip 20. Parts of the second MSB patterns 44 between these two ends are formed on the upper surface 34 within the perimeter of the chips 10 and 20.

After mounting the first and second chips 10 and 20 on the upper surface 34 of the substrate body 30 and electrically connecting each chip 10 and 20 to the substrate 30 by the bonding wires 60, the first chip 10 and the second chip 20 are sealed by the molding part 50. As a result, most of the wiring patterns 40 are included within the molding part 50.

During various test processes after the assembly process, the various semiconductor multi-chip packages that are determined to be failures are disposed of. The failures of the packages are classified into two types. One case is a package on which the two chips are both defective (referred to as "fully-failed package"); the other case is a package on which only a single chip is defective (referred to as "partially-failed package"). However, if a package is proved to be a failure, it is disposed of whether it is a fully-failed package or a partially-failed package.

In the case of partially-failed packages, since most of the wiring patterns are sealed by the molding part, it is difficult to select only a good chip by repairing the wiring patterns. As a result, packages with functional chips are discarded, reducing the yield of the manufacturing process.

SUMMARY OF THE INVENTION

Accordingly, an object of the present invention is to repair partially-failed multi-chip packages that have a mix of functional and non-functional chips and to use the repaired multi-chip packages as good packages having good chips.

In order to achieve the foregoing and other objects, the present invention provides a repairable multi-chip package. The repairable multi-chip package comprises a substrate; a first chip formed over the substrate, having a plurality of first terminals; a second chip formed over the substrate, having a plurality of second terminals; a molding part comprising molding resin formed over the first chip and the second chip; and a plurality of wiring patterns formed in the substrate and having portions extending beyond the molding part, the wiring patterns being electrically connected to the first and second chips through the first and second terminals, respectively, wherein the plurality of wiring patterns are arranged such that if one of the first and second chips is non-functional and the other of the first and second chips is functional, the portions of the wiring patterns extending beyond the molding part can be selectively cut to allow the functional chip to operate.

The plurality of first and second terminals each preferably comprise a first power terminal, a first ground terminal, a second power terminal, a most significant bit (MSB) terminal, a second ground terminal, and a dual terminal. The first power terminal and the first ground terminal of the first chip are preferably formed on a first edge of a first active surface of the first chip; the second power terminal, the MSB terminal, the second ground terminal, and the dual terminal of the first chip are preferably formed on a second edge of the first active surface; the first power terminal and the first ground terminal of the second are preferably formed on a first edge of a second active surface of the second chip; and the second power terminal, the MSB terminal, the second ground terminal, and the dual terminal of the first chip are preferably formed on a second edge of the second active surface.

The wiring patterns may further comprise a plurality of ground patterns for connecting the first and second chips to a ground voltage; a plurality of power patterns for connecting the first and second chip to a supply voltage; a plurality of dual patterns for transmitting a signal for the dual operation of the first and second chips to the first and second chips; and a plurality of most significant bit (MSB) patterns for selecting one of the first and second chips.

The plurality of ground patterns may comprise a first ground pattern connected to the first ground terminal of the first chip; and a second ground pattern connected to the second ground terminal of the second chip.

The plurality of power patterns may comprise a first power pattern connected to the first power terminal of the first chip and extending beyond the molding part; and a second power pattern connected to the first power terminal of the second chip, and to the first power pattern beyond the molding part.

The second power pattern is preferably formed inside of the plurality of ground patterns to prevent interference between the second power pattern and the first ground pattern.

The plurality of dual patterns may comprise a first dual pattern connected to the dual terminal and the second ground terminal of the first chip and extending beyond the molding part; a second dual pattern connected to the dual terminal and the second ground terminal of the second chip and extending beyond the molding part; and a third dual pattern connecting the first and second dual patterns together. The plurality of dual patterns may further comprise a fourth dual pattern connected to the second ground terminal of the first chip; and a fifth dual pattern connected to the second ground terminal of the second chip. In this case, the third dual pattern connects the first, second, fourth, and fifth dual patterns together.

The plurality of MSB patterns may comprise a plurality of first MSB patterns connected to the MSB terminal and the second ground terminal of the first chip and extending beyond the molding part; a second MSB pattern formed beyond the molding part and connected to the first MSB patterns; and a third MSB pattern connected to the second power terminal of the second chip, and to the second MSB pattern between two of the first MSB patterns. A portion of the third MSB pattern is preferably formed within the perimeter of the first and second chips.

The wiring patterns are preferably formed such that if the first chip is a functioning chip and the second chip is a non-functioning chip, the second chip can be isolated by cutting the second power pattern, the third MSB pattern, the first dual pattern, and the second dual pattern, all beyond the molding part.

The wiring patterns are also preferably formed such that if the first chip is a nonfunctioning chip and the second chip is a functioning chip, the first chip can be isolated by cutting the first power pattern, the first MSB patterns, the first dual pattern, and the second dual pattern, all beyond the molding part.

BRIEF DESCRIPTION OF THE DRAWINGS

The various features and advantages of the present invention will be readily understood with reference to the following detailed description taken in conjunction with the accompanying drawings, wherein like reference numerals designate like structural elements, and, in which.

DETAILED DESCRIPTION OF THE PREFERRED EMBODIMENTS

A preferred embodiment of the present invention will be described below with reference to the accompanying drawings.

Figure 1:
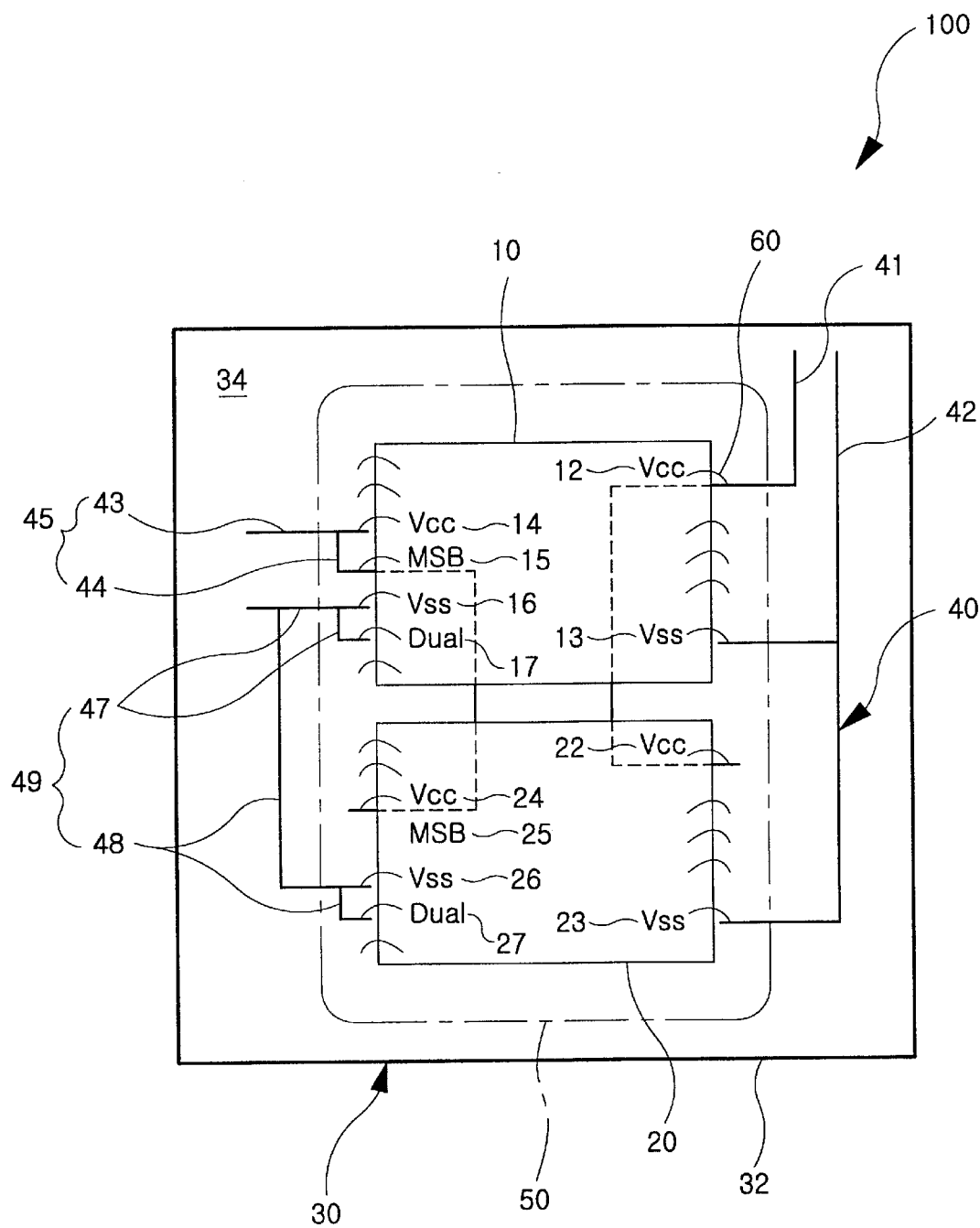
FIG. 1 is a plan view showing a conventional multi-chip package including two semiconductor chips.
Figure 2:
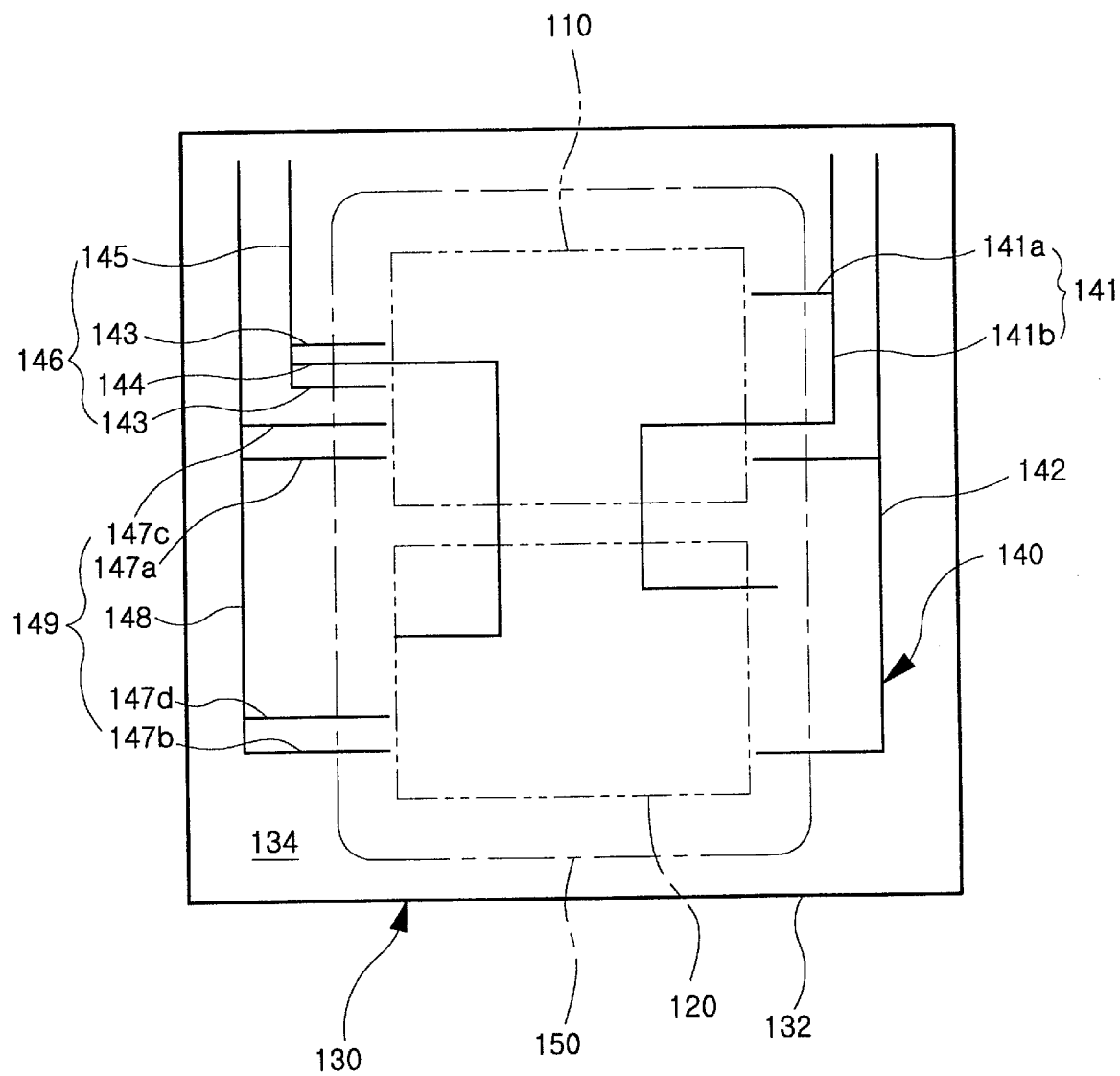
FIG. 2 is a plan view showing a substrate for a multi-chip package in accordance with a preferred embodiment of the present invention.
Figure 3:
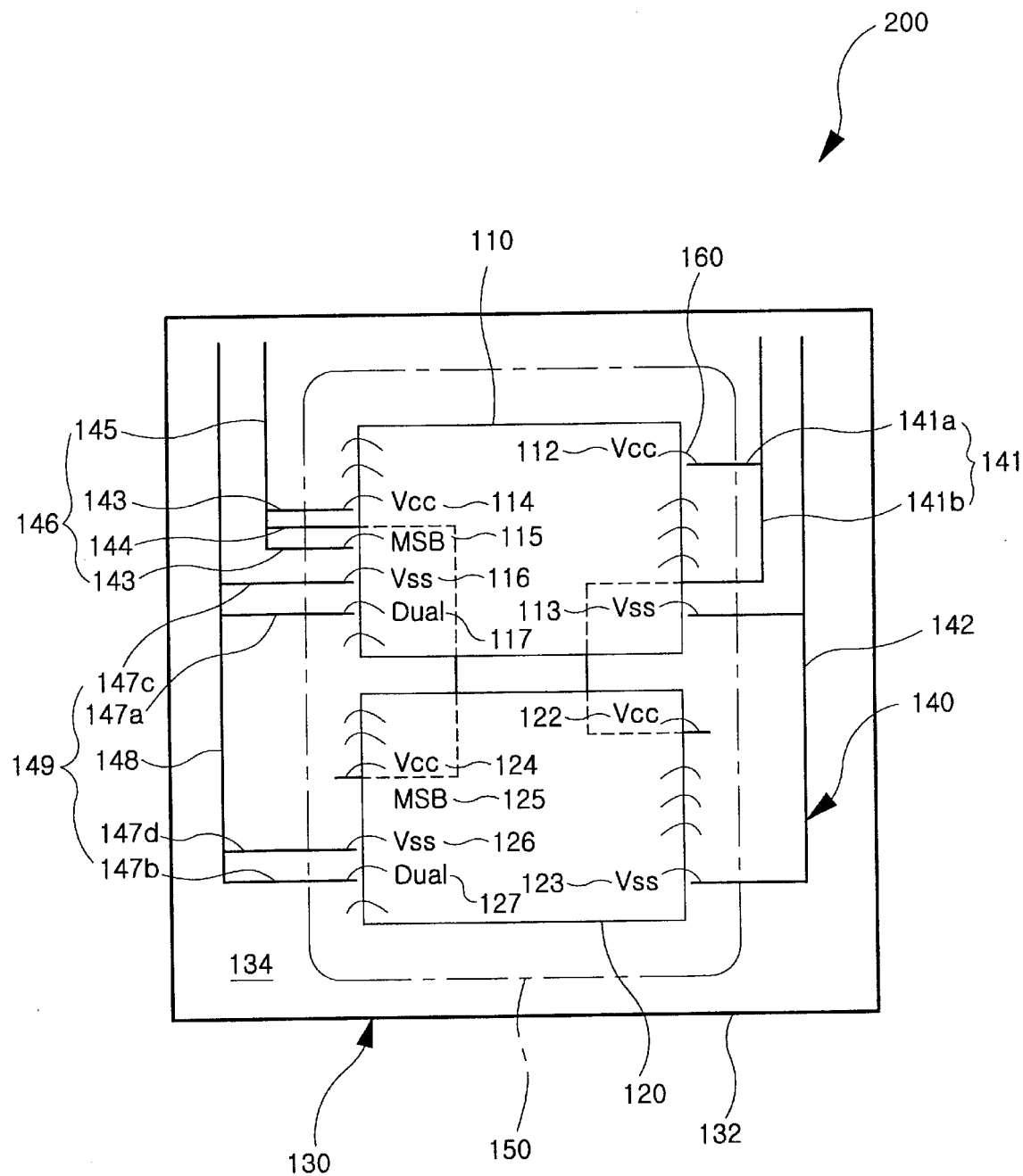
FIG. 3 is a plan view showing a multi-chip package including two semiconductor chips mounted on the substrate of FIG. 2.

FIG. 2 shows a substrate 130 for a multi-chip package in accordance with a preferred embodiment of the present invention. FIG. 3 is a plan view of a multi-chip package 200 comprising two semiconductor chips 110 and 120 mounted on the substrate 130 of FIG. 2. With reference to FIG. 2 and FIG. 3, the multi-chip package 200 is preferably employed on a memory card such as a smart media. In this embodiment, the first chip 110 and the second chip 120 are mounted on an upper surface 134 of the substrate 130 and are sealed with a liquid molding resin, thereby forming a molding part 150. The first chip 110 and the second chip 120 are preferably electrically interconnected to the substrate 130 by bonding wires 160. A plurality of external connection terminals (not shown) are formed on a lower surface of the substrate 130.

The multi-chip package 200 comprises wiring patterns 140, which allow a partially-failed package having one failed chip to operate as a multi-chip package having the capacity of only a single good chip. In other words, the wiring patterns 140 of the multi-chip package 200 are designed so that the multi-chip package 200 with one failed chip may still be operated by blocking the failed chip and only using the remaining good chip. This embodiment can repair the wiring patterns 140 to successfully operate the remaining good chip since the wiring patterns 140 are formed outside of the perimeter of the molding part 150. Their detailed descriptions will be provided below.

The first chip 110 and the second chip 120 are preferably memory chips with the same capacitance. A plurality of electrode terminals are formed both edges of the active surface of each chip 110 and 120. In this preferred embodiment, the electrode terminals of the first chip 110 comprise a first power terminal 112, a first ground terminal 113, a second power terminal 114, a most significant bit (MSB) terminal 115, a second ground terminal 116, and a dual terminal 117. The first power terminal 112 and the first ground terminal 113 are preferably arranged on one edge of the active surface of the first chip 110, and the second power terminal 114, the MSB terminal 115, and the dual terminal 117 are preferably arranged on the opposite edge.

Similarly, the electrode terminals of the second chip 120 comprise a first power terminal 122, a first ground terminal 123, a second power terminal 124, an MSB terminal 125, a second ground terminal 126, and a dual terminal 127. The first power terminal 122 and the first ground terminal 123 are arranged on one edge of the active surface of the second chip 120, and the second power terminal 124, the MSB terminal 125, and the dual terminal 127 are arranged on the opposite edge. The electrode terminals of the first and second chips 110 and 120 further comprise data terminals and address terminals.

The first chip 110 and the second chip 120 are preferably designed so that the two chips 110 and 120 are dually operated. However, in this embodiment, only one chip of two chips 110 and 120 can be independently operated.

The substrate 130 comprises a substrate body 132 having an upper surface 134 and a lower surface, (not shown), and the wiring patterns. The first chip 110 and the second chip 120 are mounted on the upper surface 134. The wiring patterns 140 are formed on the upper surface 134, and are electrically interconnected to the first chip 110 and the second chip 120. A plurality of external connection terminals (not shown) are formed on the lower surface, and are electrically interconnected to the wiring patterns 140 on the upper surface 134 through via holes (not shown).

The wiring patterns 140 are patterned so that the first chip 110 and the second chip 120 are dually and simultaneously operated, and so that, even though the multi-chip package may be determined to be a partially-failed package comprising one failed chip, the multi-chip package will still be able to function. Data patterns (not shown) and address patterns (not shown) are formed on the upper surface 134 so that all the data terminals and all of the address terminals are commonly owned.

Ground patterns 142 are electrically connected to the first ground terminal 113 of the first chip 110 and to the first ground terminal 123 of the second chip 120. Power patterns 141 electrically connect the first power terminal 112 of the first chip 110 and the first power terminal 122 of the second chip 120 to each other. The power patterns 141 are mostly exposed from the molding part 150, and thereby a repairing process is more easily accomplished on these patterns. The power patterns 141 preferably comprise a first power pattern 141a and a second power pattern 141b. In this embodiment, one end of the first power pattern 141a is connected to the first power terminal 112 of the first chip 110 and one end of the second power patterns 141b is connected to the first power terminal 122 of the second chip 120. The other end of the first power patterns 141a and the other end of the second power patterns 141b are connected to each other and extend from the molding part 150.

In order to prevent interference between the second power patterns 141b and the ground patterns 142, a part of the second power pattern 141b that connects the first power terminal 112 of the first chip 110 to the first power terminal 122 of the second chip 120 is formed inside of the ground pattern 142. As shown in FIGS. 2 and 3, the second power pattern 141b starts close to the ground patterns 142, is bent toward the first chip 110, turns around the first ground terminal 113 of the first chip 110, and forms an end before the first power terminal 122 of the second chip 120. The end of the second power patterns 141b is electrically connected to the first power terminal 122 of the second chip 120 by the bonding wire 160.

Dual patterns 149 serve to transmit a signal for dual operation of the first and second chips 110 and 120 and extend from the molding part 150. As a result, the repairing process is more easily accomplished. The dual patterns 149 comprise first dual pattern 147a, a second dual patterns 147b, a third dual pattern 148, a fourth dual pattern 147c, and a fifth dual pattern 147d. The first and fourth dual patterns 147a and 147c connect to the dual terminal 117 and the second ground terminal 116 of the first chip 110 to each other; and the second and third dual patterns 147b and 147d connect the dual terminal 127 and the second ground terminal 126 of the second chip 120 to each other. The first, second, fourth, and fifth dual patterns 147a-147d extend beyond the molding part 150 and are connected to each other by the third dual pattern 148.

Most significant bit (MSB) patterns 146, which serve to select one of the first and second chips 110 and 120, also extend away from the molding part 150, thus allowing their rewiring process to be more easily accomplished. The MSB patterns 146 comprise first MSB patterns 143, a second MSB pattern 145, and a third MSB pattern 144. One end of each of the first MSB patterns 143 are respectively connected to the MSB terminal 115 and to the second power terminal 114 of the first chip 110 by the bonding wires 160.

The other ends of each of the first MSB patterns 143 extend beyond the molding part 150. The second MSB pattern 145 is connected to the extended ends of the first MSB patterns 143. One end of the third MSB pattern 144 is connected to the second MSB pattern 145 between two first MSB patterns 143, and the other end of the third MSB pattern 144 is connected to the second power terminal 124 of the second chip 120. A portion of the third MSB pattern is formed within the perimeter of the first and second chips 110 and 120.

In other words, the third MSB pattern 144 starts between two first MSB patterns 143, extends below the first chip 110, is bent toward the second chip 120, turns around the MSB terminal 115, the second ground terminal 116, and the dual terminal 117 of the first chip 110, and forms its exposed end on the front of the second power terminal 124 of the second chip 120. The exposed end of the third MSB pattern 144 is then electrically connected to the second power terminal 124 a bonding wire 160. In order to prevent the interference between the second dual patterns 148 and the second MSB pattern 145, the second MSB pattern 145 is formed on the inside of the second dual patterns 148.

The wiring patterns 140 are designed to be suitable for a multi-chip package 200 on which two chips, i.e. the first and second chip 110 and 120, are dually operated. Furthermore, the wiring patterns 140 can be used, even if the multi-chip package 200 is determined to be a partially-failed package having a failed chip by repairing the parts of the wiring patterns 140 extending from the molding part 150. For example, FIG. 4 shows a multi-chip package 200a, wherein only the first chip 110 is operated by repairing the multi-chip package 200 of FIG. 3, and FIG. 5 shows a multi-chip package 200b, wherein only the second chip 120 is operated by repairing the multi-chip package 200 of FIG. 3.

In the preferred embodiments of the present invention, the power patterns, the dual patterns, and MSB patterns may be redistributed so that only one of two chips (i.e., a good chip) is operated. Each chip can be independently operated by cutting a connection parts of the wiring patterns, which connect the dual terminals to the MSB terminals. In these examples, only one chip selected from the first and second chips is operated by selectively cutting either one of two power patterns for providing power to the first chip or to the second chip. In this way, a redistribution process for providing power to only the functional chip is carried out.

Figure 4:
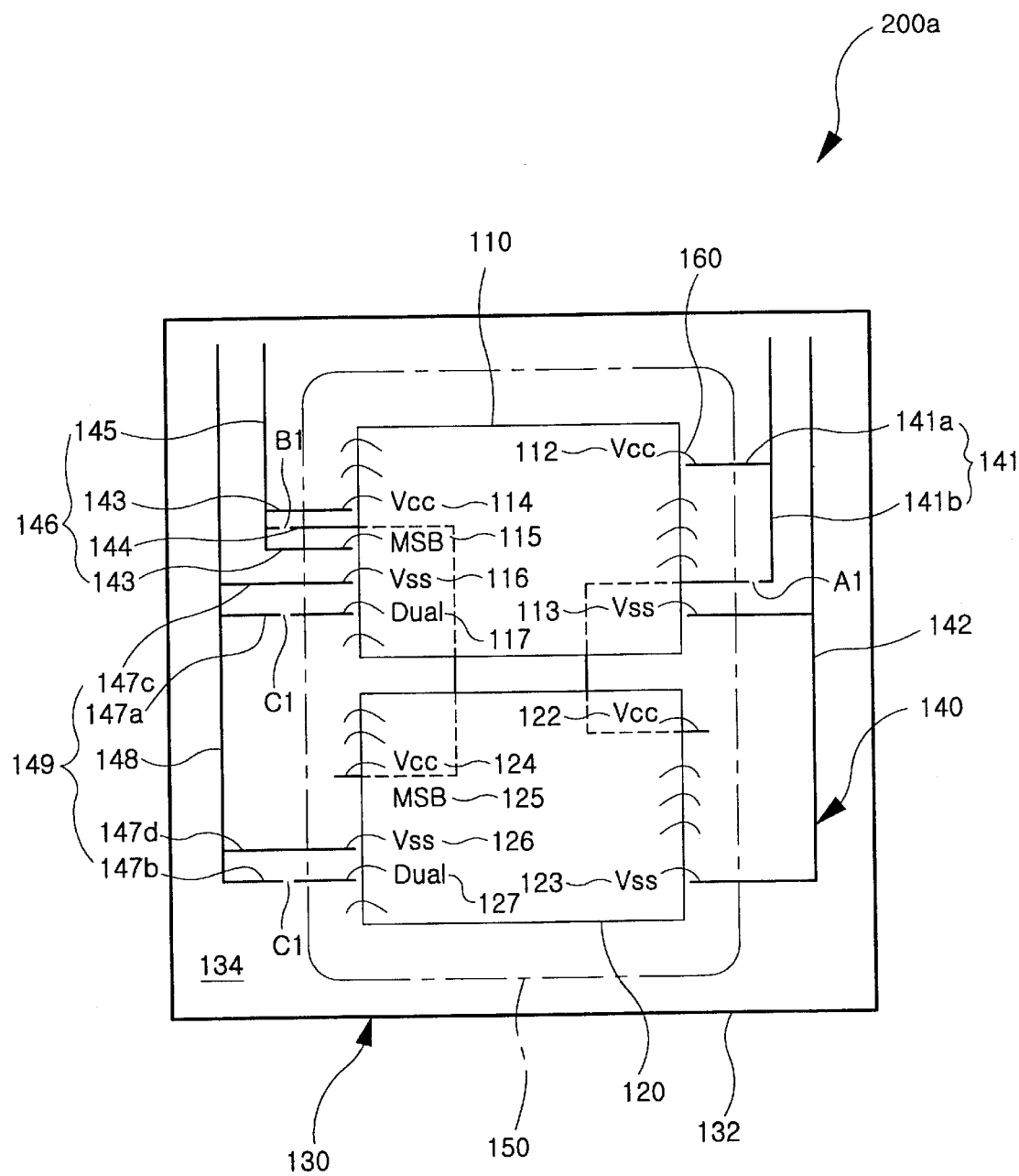
FIG. 4 is a plan view showing a multi-chip package, wherein only a first chip is operated by repairing the multi-chip package of FIG. 3.
Figure 5:
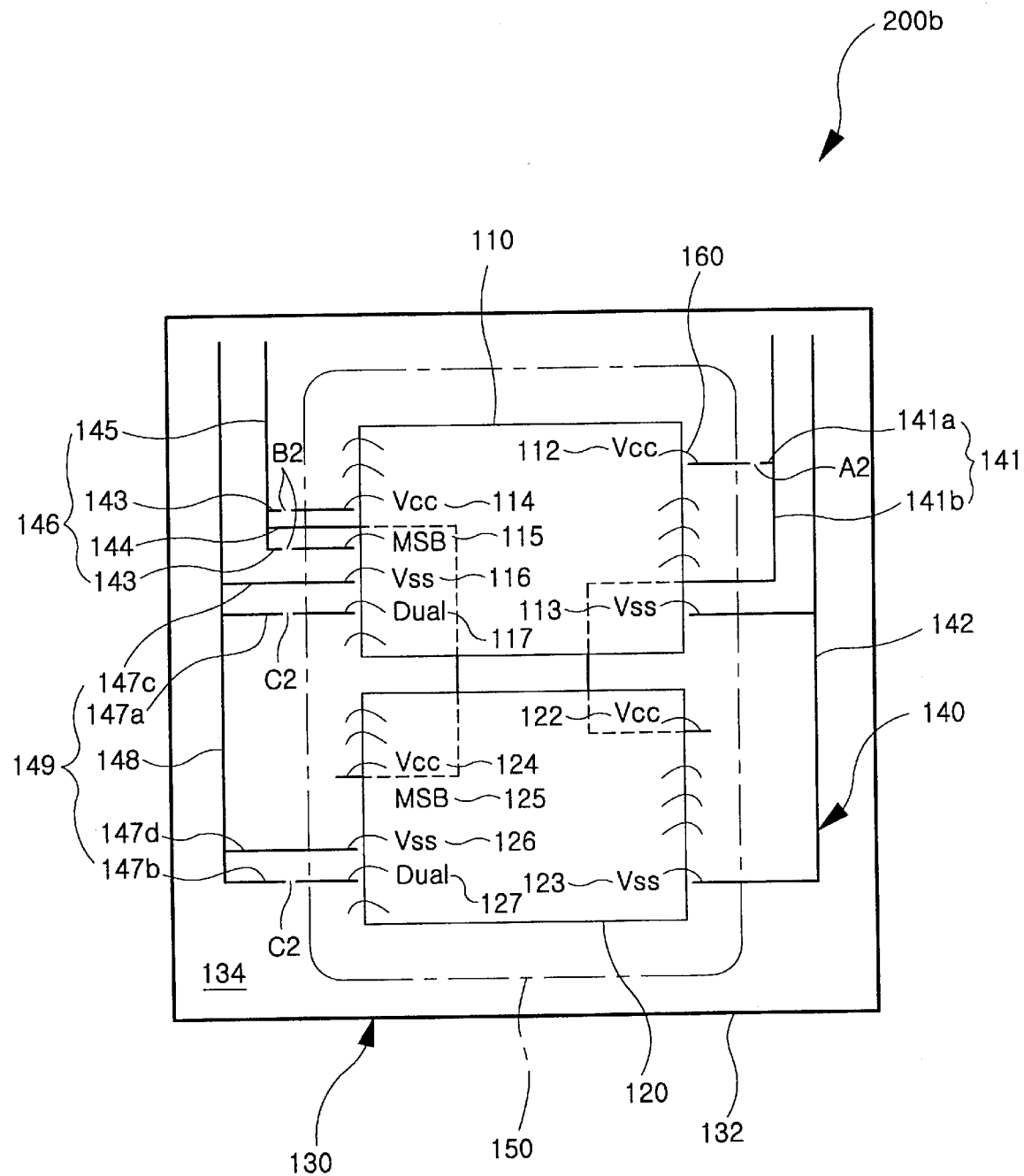
FIG. 5 is a plan view showing a multi-chip package, wherein only a second chip is operated by repairing the multi-chip package of FIG. 3.

As shown in FIG. 4, the wiring patterns 140 are redistributed so that the multi-chip package 200a is worked by operating only the first chip 110. A part of the second power pattern 141b is cut by a cutting means such as laser or blade, so that power is provided to the first power terminal 112 of the first chip 110 but is blocked from going to the first power terminal 122 of the second chip 120. In FIG. 4, a reference numeral "A1" represents the cutting part of the second power pattern 141b, which cutting part A1 is exposed from the molding part 150.

The third MSB pattern 144 for connecting the second MSB pattern 145 to the second power terminal 124 of the second chip 120 is also cut. A reference numeral "B1" represents the cutting part of the third MSB pattern 144. The cutting part B1 of the third MSB pattern 144 is close to the second MSB pattern 145 and is also exposed from the molding part 150. By cutting the third MSB pattern 144, the power supply is blocked to the second power terminal 124 of the second chip 120.

The first dual pattern 147a connected to the dual terminal 117 of the first chip 110 and the second dual patterns 147b connected to the dual terminal 127 of the second chip 120 are also cut. A reference numeral "C1" represents the cutting part of the first and second dual patterns 147a and 147b. The cutting parts C1 of the first and second dual patterns 147a and 147b are close to the third dual patterns 148 and exposed from the molding part 150. By cutting the first and second dual patterns 147a and 147b, the multi-chip package 200a is operated using only the first chip 110.

It is unimportant which among the step of cutting the second power patterns 141b, cutting the third MSB patterns 144, and cutting the first and second dual patterns 147a and 147b are carried out first.

As shown in FIG. 5, the wiring patterns 140 are redistributed so that the multi-chip package 200a is operated using only the second chip 120. A part of the first power pattern 141a is cut so that power is provided to the first power terminal 122 of the second chip 120 but is blocked from going to the first power terminal 112 of the first chip. In FIG. 5, a reference numeral "A2" represents the cutting part of the first power pattern 141a, which cutting part A2 is exposed from the molding part 150.

Two first MSB patterns 143, each connected to the second power terminal 114 and to the MSB terminal 115, respectively of the first chip 110 are cut. A reference numeral "B2" represents the cutting parts of the first MSB patterns 143, which cutting parts B2 are exposed from the molding part 150. By cutting the first MSB patterns 143, power supply through the second power terminal 114 of the first chip 110 is blocked.

As in the embodiment of FIG. 4, the first dual pattern 147a connected to the dual terminal 117 of the first multi-chip and the second dual pattern 147b connected to the dual terminal 127 of the second chip 120 are cut also. A reference numeral "C2" represents the cutting part of the first and second dual patterns 147a and 147b. By cutting the first and second dual patterns 147a and 147b, the multi-chip package 200a is operates only the second chip 120.

It is unimportant which among the step of cutting the first power patterns 141a, cutting the first MSB patterns 143, and cutting the first and second dual patterns 147a and 147b, are carried out first.

In accordance with preferred embodiments of the present invention, the wiring patterns are formed on the upper surface of the substrate body so that two chips are dually operated. Since parts of the wiring patterns to be redistributed extend from beneath the molding part, a partially-failed package is easily repaired by the redistribution process and may therefore be reused.

Although the preferred embodiments of the present invention employ a multi-chip package for a memory card, a multi-chip package using other connection methods such as solder balls as external connection terminals may also be employed. In this multi-chip package having solder balls, wiring patterns for redistributing the power patterns, the dual patterns, and the MSB patterns are formed on the lower surface around the edges. In this way, the redistribution process for selecting one chip (i.e., a good chip) from the first and second chips of the partially-failed package can be achieved.

Furthermore, although the disclosed embodiments show designs with two chips on a substrate, embodiments using greater numbers of chips are well within the scope of this invention.

Although the preferred embodiments of the present invention have been described in detail above, it should be understood that many variations and/or modifications of the basic inventive concepts herein taught which may appear to those skilled in the art will still fall within the spirit and scope of the present invention as defined in the appended claims.

What is claimed is:

1. A repairable multi-chip package comprising:
   a substrate;
   a first chip formed over the substrate, having a plurality of first terminals;
   a second chip formed over the substrate, having a plurality of second terminals;
   a molding part comprising molding resin formed over the first chip and the second chip; and
   a plurality of wiring patterns formed in the substrate and having portions extending beyond the molding part, the wiring patterns being electrically connected to the first and second chips through the first and second terminals, respectively,
   wherein the plurality of wiring patterns are arranged such that if one of the first and second chips is non-functional and the other of the first and second chips is functional, the portions of the wiring patterns extending beyond the molding part can be selectively cut to allow the functional chip to operate.

2. A repairable multi-chip package, as recited in claim 1, wherein the plurality of first and second terminals each comprise a first power terminal, a first ground terminal, a second power terminal, a most significant bit (MSB) terminal, a second ground terminal, and a dual terminal.

3. A repairable multi-chip package, as recited in claim 2,
   wherein the first power terminal and the first ground terminal of the first chip are formed on a first edge of a first active surface of the first chip,
   wherein the second power terminal, the MSB terminal, the second ground terminal, and the dual terminal of the first chip are formed on a second edge of the first active surface,
   wherein the first power terminal and the first ground terminal of the second are formed on a first edge of a second active surface of the second chip, and
   wherein the second power terminal, the MSB terminal, the second ground terminal, and the dual terminal of the first chip are formed on a second edge of the second active surface.

4. A repairable multi-chip package, as recited in claim 2, wherein the wiring patterns further comprise:
   a plurality of ground patterns for connecting the first and second chips to a ground voltage;
   a plurality of power patterns for connecting the first and second chip to a supply voltage;
   a plurality of dual patterns for transmitting a signal for the dual operation of the first and second chips to the first and second chips; and
   a plurality of most significant bit (MSB) patterns for selecting one of the first and second chips.

5. A repairable multi-chip package, as recited in claim 4, wherein the plurality of ground patterns comprise:
   a first ground pattern connected to the first ground terminal of the first chip; and
   a second ground pattern connected to the second ground terminal of the second chip.

6. A repairable multi-chip package, as recited in claim 5, wherein the plurality of power patterns comprise:
   a first power pattern connected to the first power terminal of the first chip and extending beyond the molding part; and
   a second power pattern connected to the first power terminal of the second chip, and to the first power pattern beyond the molding part.

7. A repairable multi-chip package, as recited in claim 6, wherein the second power pattern is formed inside of the plurality of ground patterns to prevent interference between the second power pattern and the first ground pattern.

8. A repairable multi-chip package, as recited in claim 6, wherein the plurality of dual patterns comprise:
   a first dual pattern connected to the dual terminal and the second ground terminal of the first chip and extending beyond the molding part;
   a second dual pattern connected to the dual terminal and the second ground terminal of the second chip and extending beyond the molding part; and
   a third dual pattern connecting the first and second dual patterns together.

9. A repairable multi-chip package, as recited in claim 8, wherein the plurality of dual patterns further comprises:
   a fourth dual pattern connected to the second ground terminal of the first chip; and
   a fifth dual pattern connected to the second ground terminal of the second chip,
   wherein the third dual pattern connects the first, second, fourth, and fifth dual patterns together.

10. A repairable multi-chip package, as recited in claim 9, wherein the plurality of MSB patterns comprise:
    a plurality of first MSB patterns connected to the MSB terminal and the second ground terminal of the first chip and extending beyond the molding part;
    a second MSB pattern formed beyond the molding part and connected to the first MSB patterns; and
    a third MSB pattern connected to the second power terminal of the second chip, and to the second MSB pattern between two of the first MSB patterns.

11. The repairable multi-chip package of claim 10, wherein a portion of the third MSB pattern is formed within the perimeter of the first and second chips.

12. The repairable multi-chip package of claim 10, wherein the wiring patterns are formed such that if the first chip is a functioning chip and the second chip is a non-functioning chip, the second chip can be isolated by cutting the second power pattern, the third MSB pattern, the first dual pattern, and the second dual pattern, all beyond the molding part.

13. The repairable multi-chip package of claim 10, wherein the wiring patterns are formed such that if the first chip is a non-functioning chip and the second chip is a functioning chip, the first chip can be isolated by cutting the first power pattern, the first MSB patterns, the first dual pattern, and the second dual pattern, all beyond the molding, part.

* * * * *